United States Patent
Lin et al.

(10) Patent No.: US 8,487,317 B2
(45) Date of Patent: Jul. 16, 2013

(54) GAN SEMICONDUCTOR DEVICE

(75) Inventors: Yi-Chieh Lin, Hsinchu (TW); Cheng-Ta Kuo, Hsinchu (TW); Yu-Pin Hsu, Hsinchu (TW); Chi-Ming Tsai, Hsinchu (TW)

(73) Assignee: Epistar Corporation (TW)

( * ) Notice: Subject to any disclaimer, the term of this patent is extended or adjusted under 35 U.S.C. 154(b) by 493 days.

(21) Appl. No.: 12/382,955

(22) Filed: Mar. 27, 2009

(65) Prior Publication Data

US 2009/0256159 A1 Oct. 15, 2009

(30) Foreign Application Priority Data

Mar. 27, 2008 (TW) ................................. 97111210 A

(51) Int. Cl.
*H01L 33/00* (2010.01)
*H01L 29/20* (2006.01)

(52) U.S. Cl.
USPC ..... 257/76; 257/103; 257/E29.089; 257/E33.023

(58) Field of Classification Search
USPC .......................................................... 257/76
See application file for complete search history.

(56) References Cited

U.S. PATENT DOCUMENTS

| | | | |
|---|---|---|---|
| 6,285,696 B1 * | 9/2001 | Bour et al. | 372/45.01 |
| 2004/0256613 A1 * | 12/2004 | Oda et al. | 257/19 |
| 2005/0127394 A1 * | 6/2005 | Nagahama et al. | 257/103 |
| 2005/0167686 A1 * | 8/2005 | Seo | 257/98 |
| 2008/0023835 A1 | 1/2008 | Tsai et al. | |
| 2008/0220535 A1 * | 9/2008 | LeBoeuf et al. | 436/164 |

FOREIGN PATENT DOCUMENTS

| | | |
|---|---|---|
| CN | 1205556 A | 2/1999 |
| TW | 486829 B | 11/1989 |

OTHER PUBLICATIONS

Takao Misaki*, Akihiro Wakahara, Hiroshi Okada, Akira Yoshida, Epitaxial growth and characterization of ZnGeN2 by metalorganicvapor phase epitaxy, 2004, Journal of Crystal Growth 260 (2004) 125-129.*

Takao Misaki*, Akihiro Wakahara, Hiroshi Okada, Akira Yoshida, Epitaxial growth and characterization of ZnGeN2 by metalorganicvapor phase epitaxy, 2004, Journal of Crystal Growth 260 (2004) 125-129.*

* cited by examiner

*Primary Examiner* — Zandra Smith
*Assistant Examiner* — Lawrence Tynes, Jr.
(74) *Attorney, Agent, or Firm* — Bacon & Thomas, PLLC

(57) ABSTRACT

This invention discloses a GaN semiconductor device comprising a substrate; a metal-rich nitride compound thin film on the substrate; a buffer layer formed on the metal-rich nitride compound thin film, and a semiconductor stack layer on the buffer layer wherein the metal-dominated nitride compound thin film covers a partial upper surface of the substrate. Because metal-rich nitride compound is amorphous, the epitaxial growth direction of the buffer layer grows upwards in the beginning and then turns laterally, and the epitaxy defects of the buffer layer also bend with the epitaxial growth direction of the buffer layer. Therefore, the probability of the epitaxial defects extending to the semiconductor stack layer is reduced and the reliability of the GaN semiconductor device is improved.

20 Claims, 5 Drawing Sheets

GAN SEMICONDUCTOR DEVICE

TECHNICAL FIELD

This invention discloses a GaN semiconductor device, especially related to the GaN semiconductor device having a metal-rich nitride thin film to improve the semiconductor epitaxial quality.

REFERENCE TO RELATED APPLICATION

The present application claims the right of priority based on Taiwan Application Serial Number 097111210, filed on 2008 Mar. 27, the disclosure of which is incorporated herein by reference in its entirety.

BACKGROUND

Recently, the semiconductor material is widely applied in the electronic device, the integral circuits, and the solid lighting device. According to FIG. 1, the epitaxial defects 14, such as dislocations, usually occur in the epitaxial process due to the lattice constant mismatch between the substrate 10 and the semiconductor stack layer 12 in the semiconductor device 100. These epitaxial defects deeply affect the electrical property of the semiconductor materials and lower the reliability of the semiconductor device.

With reference to FIG. 2, there is a buffer layer 22 on the substrate 20 of the semiconductor device 200, wherein the lattice constant of the buffer layer 20 is matched with the lattice constant of the substrate, to overcome the aforementioned epitaxial defects problems. However, there are still some dislocations extending through the buffer layer 22 to the semiconductor stack layer 26.

FIGS. 3A and 3B show another manufacturing process of the conventional semiconductor device 300. The manufacturing process of the conventional semiconductor device 300 comprises, with reference to FIG. 3A, providing a substrate 30 and forming several buffer bodies 32 on the substrate 30, and then forming a buffer layer 34 on the substrate 30 and the buffer bodies 32, wherein the material of the buffer body 32 is amorphous, such as $SiO_2$ and $SiN_x$, and the buffer layer 34 is semiconductor. Because the buffer layer 34 can not grow on the amorphous buffer body 32, the buffer layer 34, according to the arrow a, grows vertically on the surface of substrate where is not covered by the buffer body 32 in advance, and then the buffer layer 34 grows laterally and covers the buffer body 32 when the thickness of the buffer layer 34 is larger than that of the buffer body 32. Subsequently, the semiconductor stack layer 36 is formed on the buffer layer 34 according to FIG. 3B. During the aforementioned epitaxial process, there are several epitaxial defects formed. The epitaxial defects are formed from the substrate surface which is not covered by the buffer body 32 and then bends with the growth direction of the buffer layer 32 to reduce the epitaxial defects of the semiconductor stack layer 36.

Although the technique mentioned above is capable of reducing epitaxial defects during the epitaxial process, there are still some defects extending from the buffer layer to the semiconductor stack layer to affect the electrical property and reliability of the semiconductor device.

SUMMARY

To solve the aforementioned problems, this invention provides a GaN semiconductor device structure comprising a metal-rich nitride compound thin film.

This invention disclose a GaN semiconductor device comprises a substrate; a metal-rich nitride thin film on the substrate; a buffer layer on the metal-rich nitride thin film; and a semiconductor layer on the buffer layer.

This invention also discloses a GaN semiconductor device comprising a metal-rich nitride thin film to reduce the epitaxial defects of the semiconductor and improve the epitaxial quality and reliability of the semiconductor device.

This invention further discloses a light-emitting device comprising a metal-rich nitride thin film to prevent the epitaxial defect from extending upward and improve the light-emitting efficiency of the light-emitting device.

DETAILED DESCRIPTION OF A PREFERRED EMBODIMENTS

This invention discloses a GaN semiconductor device. FIGS. 4A to 6B are the figures of the preferred embodiments in this invention.

FIGS. 4A to 4D are the figures of manufacturing process of a GaN semiconductor device 400. According FIG. 4A, the manufacturing process of the GaN semiconductor device 400 comprises providing a substrate 40, wherein the substrate is selected from the group of sapphire, SiC, Si, ZnO, GaN, metal and transparent material. Then, with reference to FIG. 4B, providing $Cp_2Mg$, $SiH_4$ and $NH_3$ gases to form a metal-rich nitride thin film 42 on the substrate 40 with Chemical Vapor Deposition (CVD) technique, wherein the metal-rich nitride thin film 42 covers the substrate partially and the coverage ratio is less than 60%. Moreover, the metal-rich nitride thin film 42 is a discontinuous structure, such as a plurality of discontinuous mesas or a polarity of island-like structures.

Besides, the metal-rich nitride thin film 42 is at least one material selected from the group of MgSiN, ZnSiN, MgGeN and ZnGeN series material, wherein the metal composition is more than twice as the non-metal composition in the metal-rich nitride thin film 42.

Figure 1:
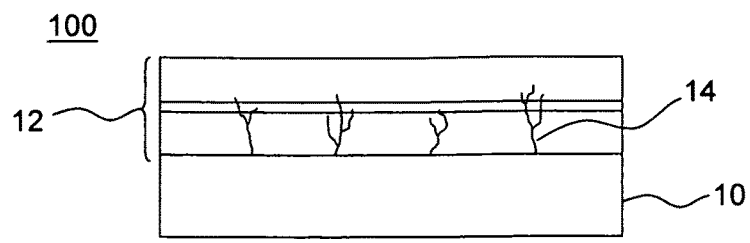
FIG. 1 shows a schematic diagram of a conventional semiconductor device structure.
Figure 2:
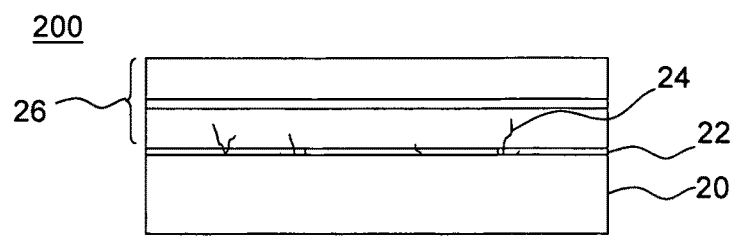
FIG. 2 shows a schematic diagram of another type of conventional semiconductor device structure.
Figure 3A:
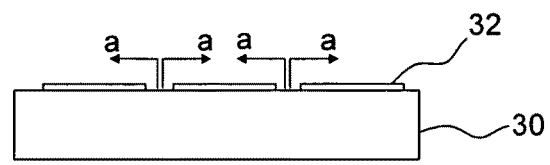
FIGS. 3A-3B show schematic diagrams of further another type of conventional semiconductor device structure.
Figure 3B:
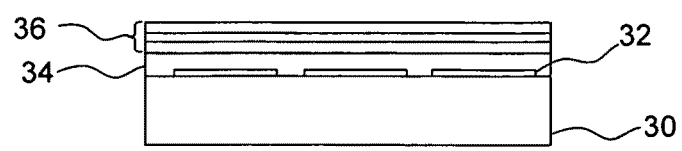
Figure 4A:
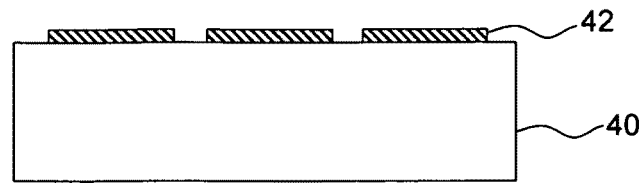
FIGS. 4A-4C show a schematic diagram of a manufacturing process of a GaN semiconductor device in accordance of one embodiment of present invention.
Figure 4B:
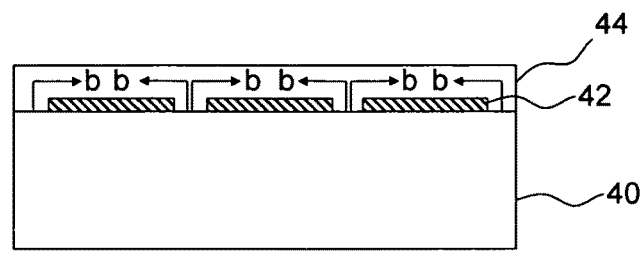
Figure 4C:
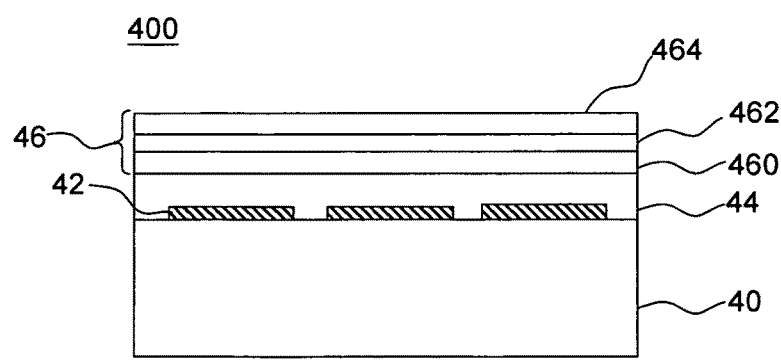

Subsequently, according to FIG. 4B, a first buffer layer 44 is formed on the metal-rich thin film 42 and the substrate 40, wherein the first buffer layer 44 is selected from GaN or AlN. The metal-rich thin film 42 is amorphous so that the semiconductor material cannot grow on the metal-rich thin film 42. Therefore, the first buffer layer 44 grows from the uncovered surface of the substrate and the growth direction of the first buffer layer 44 is showed as the arrow "b" in the FIG. 4B, wherein the first buffer layer 44 grows vertically in the beginning stage, and then turns horizontally after the thickness of the first buffer layer 44 is larger than that of the metal-rich nitride thin film 42. During the first buffer layer 44 growth process, several dislocations are formed due to the lattice constant mismatch between the buffer layer 44 and the substrate 40, and the dislocations bend with the growth direction of the first buffer layer 44. In other words, the dislocations of the first buffer layer 44 extend vertically and then turn horizontally. Then, a semiconductor stack layer 46 is formed on the first buffer layer 44, wherein the semiconductor stack layer at least comprises a first conductive type semiconductor layer 460, an active layer 462 and a second conductive type semiconductor layer 464.

Figure 4D:
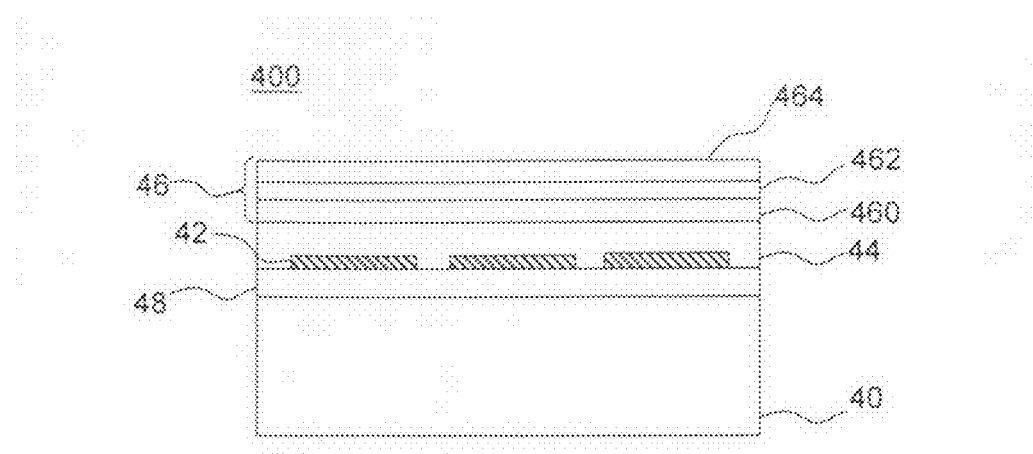
FIG. 4D shows a sectional diagram of a GaN semiconductor device in accordance with another embodiment.

FIG. 4D shows another embodiment of this invention. According to FIG. 4D, a second buffer layer 48 is formed on the substrate 40, wherein the material of the second buffer layer 48 is GaN or AlN. Then, a metal-rich nitride thin film 42 is formed on the second buffer layer 48, wherein the metal-rich nitride thin film 42 covers only the second buffer layer 48 partially. Subsequently, a first buffer layer 44 is formed over the metal-rich nitride thin film 42 and the second buffer layer 48 to stop the dislocation from extending further.

Figure 5A:
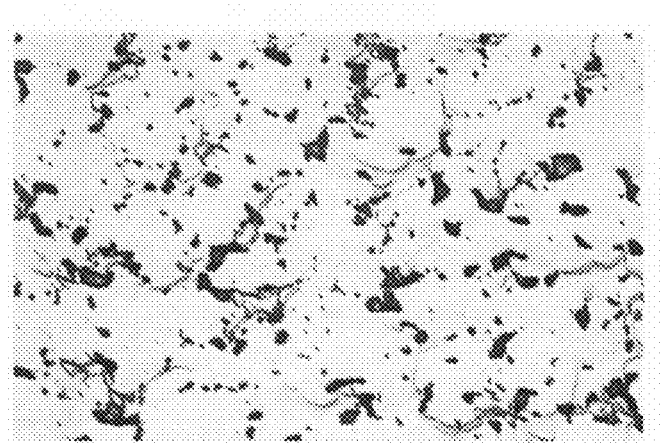
FIG. 5A shows a surface picture of a conventional semiconductor device having a $SiN_x$ buffer body.
Figure 5B:
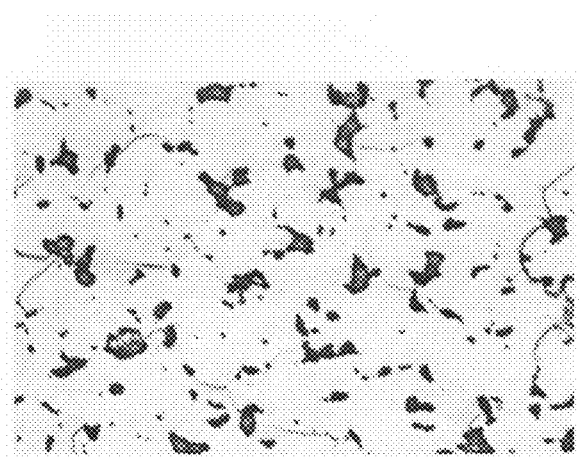
FIG. 5B shows a surface picture of a GaN semiconductor device in accordance with one embodiment of present invention.

FIG. 5A shows the 500-time optical microscope photo of the surface of the conventional semiconductor device with SiN buffer body. FIG. 5B shows the 500-time optical microscope photo of the surface of the semiconductor device with MgSiN layer as the metal-rich nitride thin film. Comparing with FIG. 5A and FIG. 5B, it shows that the defects of the semiconductor device surface in FIG. 5B are fewer than that in FIG. 5A. In brief, replacing the SiN buffer layer with the metal-rich nitride thin film is effective in reducing epitaxial dislocations and improving epitaxial quality.

Figure 6A:
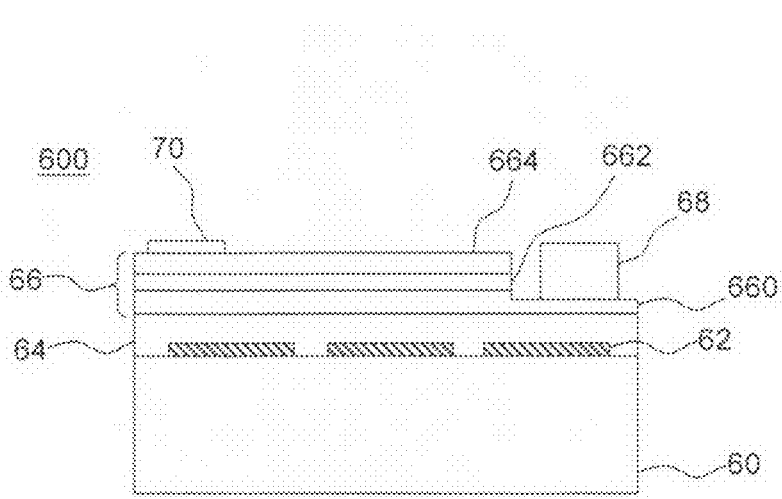
FIG. 6A shows a sectional diagram of a GaN semiconductor device in accordance with further another embodiment.

Furthermore, this invention also can be applied in the semiconductor device requiring high epitaxial quality, such as light-emitting diode (LED) device, especially the UV GaN LED. FIG. 6A shows another embodiment in this invention. According to FIG. 6A, a light-emitting diode device 600 comprises: a substrate 60, wherein the material of the substrate is sapphire, SiC, Si, ZnO, GaN or metal; a metal-rich nitride thin film 62 on the substrate 60, wherein the coverage ratio of the metal-rich nitride thin film 62 is less than 60%, MgSiN is the preferred material of the metal-rich nitride thin film 62, and the discontinuous structure is the preferred structure of the metal-rich nitride thin film 62, such as a plurality of mesas or a plurality of island-like structure; a first buffer layer 64 formed on the substrate 60 and the MgSiN layer 62, wherein the material of the first buffer layer 64 is GaN or AlN; a light-emitting stack layer 66 formed on the first buffer layer 64, wherein the material of the light-emitting stack layer 66 is GaN and the light-emitting stack layer 66 at least comprises a first conductive type semiconductor layer 660 on the first buffer layer 64, a light-emitting layer 662 on the first conductive type semiconductor layer 660, and a second conductive type semiconductor layer 664 on the light-emitting layer 662. In this embodiment, there is an exposed area of the first conductive type semiconductor layer 660, and the light-emitting device further comprises a first electrode 68 and a second electrode 70 on the top surface of the second conductive type semiconductor layer 664 and the exposed surface of the first conductive type semiconductor layer 660, respectively.

Moreover, the material of the metal-rich nitride thin film 62 is selected from the group of MgSiN, ZnSiN, MgSeN and ZnGeN series, wherein the metal composition is twice as the non-metal composition in the metal-rich nitride thin film.

Figure 6B:
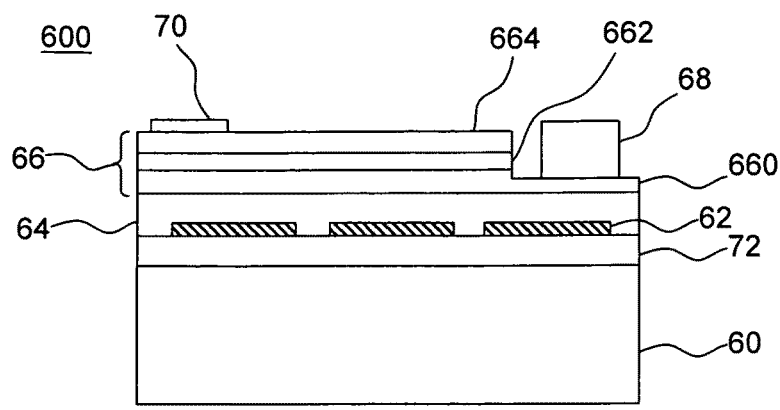
FIG. 6B shows a sectional diagram of a GaN semiconductor device in accordance with further another embodiment.

Besides, as shown in FIG. 6B, the light-emitting diode device 600 further comprises a second buffer layer 72 between the metal-rich nitride thin film 62 and the substrate 60, wherein the material of the second buffer layer 72 is GaN or AlN to prevent the dislocations from extending upwards to improve the epitaxial quality of the light-emitting diode device 600.

What is claimed is:

1. A GaN series semiconductor device, at least comprising:
   a substrate having an upper surface;
   a amorphous and single layer of metal-rich nitride thin film located on the substrate and having a top surface and a side surface;
   a first buffer layer being a semiconductor directly contacting the top surface and the side surface of the metal-rich nitride thin film; and
   a semiconductor stack layer located on the first buffer layer, wherein the metal-rich nitride thin film partially covers the upper surface of the substrate.

2. The GaN semiconductor device according to claim 1, the semiconductor stack layer further comprises:
   a first conductive type semiconductor layer, located on the buffer layer;
   an active layer, located on the first conductive type semiconductor layer; and
   a second conductive type semiconductor layer, located on the active layer.

3. The GaN semiconductor device according to claim 1, the material of the metal-rich nitride thin film is MgSiN, ZnSiN, MgGeN, or ZnGeN.

4. The GaN semiconductor device according to claim 1, the metal element in the metal-rich nitride thin film is more than twice as much as the non-metal element in the metal-rich nitride thin film.

5. The GaN semiconductor device according to claim 1, the metal-rich nitride thin film is a discontinuous thin film structure.

6. The GaN semiconductor device according to claim 5, the metal-rich nitride thin film is a plurality of island-like structures or a plurality of discontinuous mesas.

7. The GaN semiconductor device according to claim 1, the material of the first buffer layer is GaN or AlN.

8. The GaN semiconductor device according to claim 1, the GaN semiconductor device further comprises a second buffer layer located between the metal-rich nitride thin film and the substrate.

9. The GaN semiconductor device according to claim 8, the material of the second buffer layer is GaN and AlN.

10. The GaN semiconductor device according to claim 1, the GaN semiconductor device further comprises at least one electrode on the semiconductor stack layer.

11. A light-emitting device, comprising:
    a substrate, having an upper surface;
    an amorphous and single layer of metal-rich nitride thin film, located on the substrate and having a top surface and a side surface;
    a first buffer layer being a semiconductor and directly contacting the top surface and the side surface of the metal-rich thin film;
    a light-emitting stack layer, located on the first buffer layer; and
    at least one electrode, located on the light-emitting stack layer, wherein the metal-rich nitride thin film partially covers upper surface of the substrate.

12. The light-emitting device according to claim 11, the light-emitting stack layer further comprises:

a first conductive type semiconductor layer, located on the substrate;

a light-emitting layer, located on the first conductive type semiconductor layer; and a second conductive type semiconductor layer, located on the light-emitting layer.

13. The light-emitting device according claim 11, the metal element in the metal-rich nitride thin film is more than twice as much as the non-metal element in the metal-rich nitride thin film.

14. The light-emitting device according claim 11, the material of the metal-rich nitride thin film is MgSiN, ZnSiN, MgGeN, or ZnGeN.

15. The light-emitting device according claim 11, the metal-rich nitride thin film is a discontinuous thin film structure.

16. The light-emitting device according claim 15, the metal-rich nitride thin film is a plurality of island-like structures or a plurality of mesas.

17. The light-emitting device according claim 11, the material of the light-emitting stack layer is GaN series.

18. The light-emitting device according claim 11, the material of the first buffer layer is GaN or AlN.

19. The light-emitting device according claim 11, the light-emitting device further comprises a second buffer layer, located between the substrate and the metal-rich nitride thin film.

20. The light-emitting device according claim 19, the material of the second buffer layer is GaN or AlN.

* * * * *